(12) United States Patent
Taguwa

(10) Patent No.: US 7,675,119 B2
(45) Date of Patent: Mar. 9, 2010

(54) SEMICONDUCTOR DEVICE AND MANUFACTURING METHOD THEREOF

(75) Inventor: Tetsuya Taguwa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 47 days.

(21) Appl. No.: 11/952,675

(22) Filed: Dec. 7, 2007

(65) Prior Publication Data

US 2008/0150035 A1 Jun. 26, 2008

(30) Foreign Application Priority Data

Dec. 25, 2006 (JP) ............................. 2006-347874
Oct. 30, 2007 (JP) ............................. 2007-281918

(51) Int. Cl.
*H01L 29/78* (2006.01)
(52) U.S. Cl. ............... 257/369; 257/412; 257/21.409 E
(58) Field of Classification Search ................. 257/369, 257/E21.632, E29.255, E27.062, E21.409, 257/412; 438/301, 233
See application file for complete search history.

(56) References Cited

U.S. PATENT DOCUMENTS 6,492,688 B1 * 12/2002 Ilg ............................ 257/369

FOREIGN PATENT DOCUMENTS

| JP | 11-233451 A | 8/1999 |
| JP | 2003-163348 A | 6/2003 |
| JP | 2005-116693 A | 4/2005 |

* cited by examiner

*Primary Examiner*—Roy K Potter
(74) *Attorney, Agent, or Firm*—Sughrue Mion, PLLC

(57) ABSTRACT

A semiconductor device includes an N-channel transistor having an N-type gate electrode and a P-channel transistor having a P-type gate electrode which are formed on a semiconductor substrate. The P-type gate electrode includes a first silicon layer formed as the lowest layer, and doped with a P-type impurity; a second silicon layer formed on the first silicon layer; and a metal containing layer formed on the second silicon layer. The N-type gate electrode includes a third silicon layer formed as the lowest layer and doped with an N-type impurity; a fourth silicon layer formed on the third silicon layer; and a metal containing layer formed on the fourth silicon layer. At least one of the second silicon layer and the fourth silicon layer is doped with no impurity or an impurity of a conductive type opposite to that of the impurity in a corresponding one of the first silicon layer and third silicon layer.

17 Claims, 5 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof. This application is based on Japanese Patent Applications 2006-347874 and 2007-281918. These disclosures of the above Japanese Patent Applications are incorporated herein by reference.

2. Description of Related Art

Recently, in a semiconductor device, particularly DRAM (Dynamic Random Access Memory), a polymetal gate structure is employed to improve a device operation speed. In the polymetal gate structure, a metal layer is formed on a polysilicon layer, so that this structure can further reduce a word line (sheet) resistance more than a polycide gate structure which was conventionally used. However, when the metal layer (e.g., a tungsten (W) layer) is formed directly on the polysilicon layer, the metal layer reacts with the polysilicon layer in a high temperature thermal treatment to form a metal silicide layer (e.g., a tungsten silicide (WSi) layer) between the polysilicon layer and the metal layer. The metal silicide layer prevents the device from operating at a high speed since it has comparatively high resistance.

In order to cope with this problem, in Japanese Laid Open Patent application (JP-A-Heisei 11-233451), after a silicon layer is formed, a metal nitride layer is deposited on the silicon layer, and a thermal treatment is carried out to react the metal nitride layer with the silicon layer so that a thermally stable barrier layer is formed. A metal layer is formed on the barrier layer. However, when the metal nitride layer is formed directly on the polysilicon layer, the polysilicon layer reacts with the metal nitride layer in a subsequent thermal treatment to form a metal silicide nitride layer. The metal silicide nitride layer has high resistance depending on a composition or a structure of a laminated film. Thus, when the thickness of the laminate film is thick, reduction of the resistance cannot be attained.

Therefore, a technique is demanded which reduces the resistance of a gate electrode in a semiconductor device having a polymetal gate structure.

In conjunction with the above description, the inventor of the present invention proposed the following technique described in Japanese Laid Open Patent Application (JP-P2003-163348A). In the proposal, an impurity doped polysilicon layer, a first refractory metal silicide layer, a first refractory metal nitride layer, and a second refractory metal layer are laminated. Then, the laminated layers are subjected to a thermal treatment. Thus, the first refractory metal silicide layer prevents the first refractory metal layer from reacting with the impurity doped polysilicon layer, so that the silicide layer can be made thinner than a conventional one.

Further, the inventor of the present invention proposed a technique described in Japanese Laid Open Patent Application (JP-P2005-116693A), in which a silicide film of a gate electrode in a P-channel region is formed as a dispersed or discontinuous silicide film. A dual gate structure is formed in the P-channel region and an N channel region adjacent to the P-channel region. In case of the dual gate structure, before gate electrodes are patterned, a polysilicon layer in the N channel region and a polysilicon layer in the P-channel region are in a connected or continuous state. In this case, impurities may mutually diffuse between the polysilicon layers in the N channel region and the P-channel region. It is described in Japanese Laid Open Patent Application (JP-P2005-116693A), that since the mutual diffusion of the impurities is carried out through the silicide layer, the mutual diffusion of the impurities can be prevented by dispersedly or discontinuously forming the silicide layer.

However, a requirement to suppress the diffusion of impurity in the silicon layer becomes harder according to the thinning of the silicon layer for reducing the size of a semiconductor device. When a silicon layer is thinned, it is hard to implant impurity (e.g., boron) into the silicon layer. This is because the impurity penetrates the gate oxide film and is easily implanted into a semiconductor substrate. In order to prevent the impurity from being implanted into the semiconductor substrate, acceleration energy to the impurity is required to be reduced. However, when the acceleration energy of the impurity reduces, an impurity concentration increases in the surface of the silicon layer. When the impurity concentration is high in the surface of the silicon layer, the impurity is easily absorbed by the metal silicide layer, when a thermal treatment is carried out in subsequent process, because the impurity has a larger diffusion coefficient in the metal silicide than that in silicon. Therefore, the impurity is not sufficiently supplied up to a portion of the silicon layer near the gate oxide film. As a result, the operation characteristics of the semiconductor device are degraded due to a depletion layer. Thus, it was made clear that the degradation in the operation characteristics of the semiconductor device accompanied by thinning of the silicon layer could not be completely suppressed even if the above-described conventional techniques were used.

SUMMARY

Therefore, an object of the present invention is to provide a semiconductor device in which impurity can be sufficiently supplied into a silicon layer while suppressing diffusion of the impurity into a silicide layer without increase in resistance of a gate electrode, and to provide a method of manufacturing the semiconductor device.

In a first aspect of the present invention, a semiconductor device includes an N-channel transistor having an N-type gate electrode and a P-channel transistor having a P-type gate electrode which are formed on a semiconductor substrate. The P-type gate electrode includes a first silicon layer formed as the lowest layer, and doped with a P-type impurity; a second silicon layer formed on the first silicon layer; and a metal containing layer formed on the second silicon layer. The N-type gate electrode includes a third silicon layer formed as the lowest layer and doped with an N-type impurity; a fourth silicon layer formed on the third silicon layer; and a metal containing layer formed on the fourth silicon layer. At least one of the second silicon layer and the fourth silicon layer is doped with no impurity or an impurity of a conductive type opposite to that of the impurity in a corresponding one of the first silicon layer and third silicon layer.

Also, a second aspect of the present invention, a semiconductor device includes a gate electrode formed on a semiconductor substrate through a gate insulating film. The gate electrode includes a silicon layer formed in contact with the gate insulating film; and a metal containing layer formed on the silicon layer. The silicon layer includes a first silicon layer provided on the gate insulating film and doped with an impurity of a first conductive type; a second silicon layer formed on the first silicon layer and doped with no impurity or an impurity of a second conductive type opposite to the first conductive type.

In a third aspect of the present invention, a manufacturing method of a semiconductor device, is achieved by forming a gate insulating film on a semiconductor substrate; by forming a gate electrode on the gate insulating film. The forming a gate electrode is achieved by forming a first silicon layer on the gate insulating film; by implanting an impurity into the first silicon layer; by forming a second silicon layer on the first silicon layer; by forming a metal containing layer on the second silicon layer; and by patterning a laminate structure which contains the silicon layers and the metal containing layer, such that the laminate structure is separated into an N-type laminate structure in an N-channel transistor region and a P-type laminate structure in a P-channel transistor region. The implanting is achieved by implanting a p-type impurity and an N-type impurity into the P-channel transistor region and the N-channel transistor region, respectively. The second silicon layer is doped with no impurity or an impurity of a conductive type opposite to that of the impurity in the first silicon layer.

In a fourth aspect of the present invention, a manufacturing method of a semiconductor device, is achieved by forming a gate insulating film on a semiconductor substrate; by forming a gate electrode on the gate insulating film. The forming a gate electrode is achieved by forming a first silicon layer on the semiconductor substrate through the gate insulating film; by implanting an impurity of a first conductive type into the first silicon layer; by forming on the first silicon layer, a second silicon layer which is intrinsic or of a second conductive type opposite to the first conductive type, and by forming a metal containing layer on the second silicon layer.

As described above, according to the present invention, a semiconductor device is provided in which the diffusion of impurity into a silicide layer can be suppressed without increasing a resistance of a gate electrode, while sufficiently supplying the impurity in a silicon layer, and a manufacturing method of the semiconductor device is also provided.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE PREFERRED EMBODIMENTS

Figure 1:
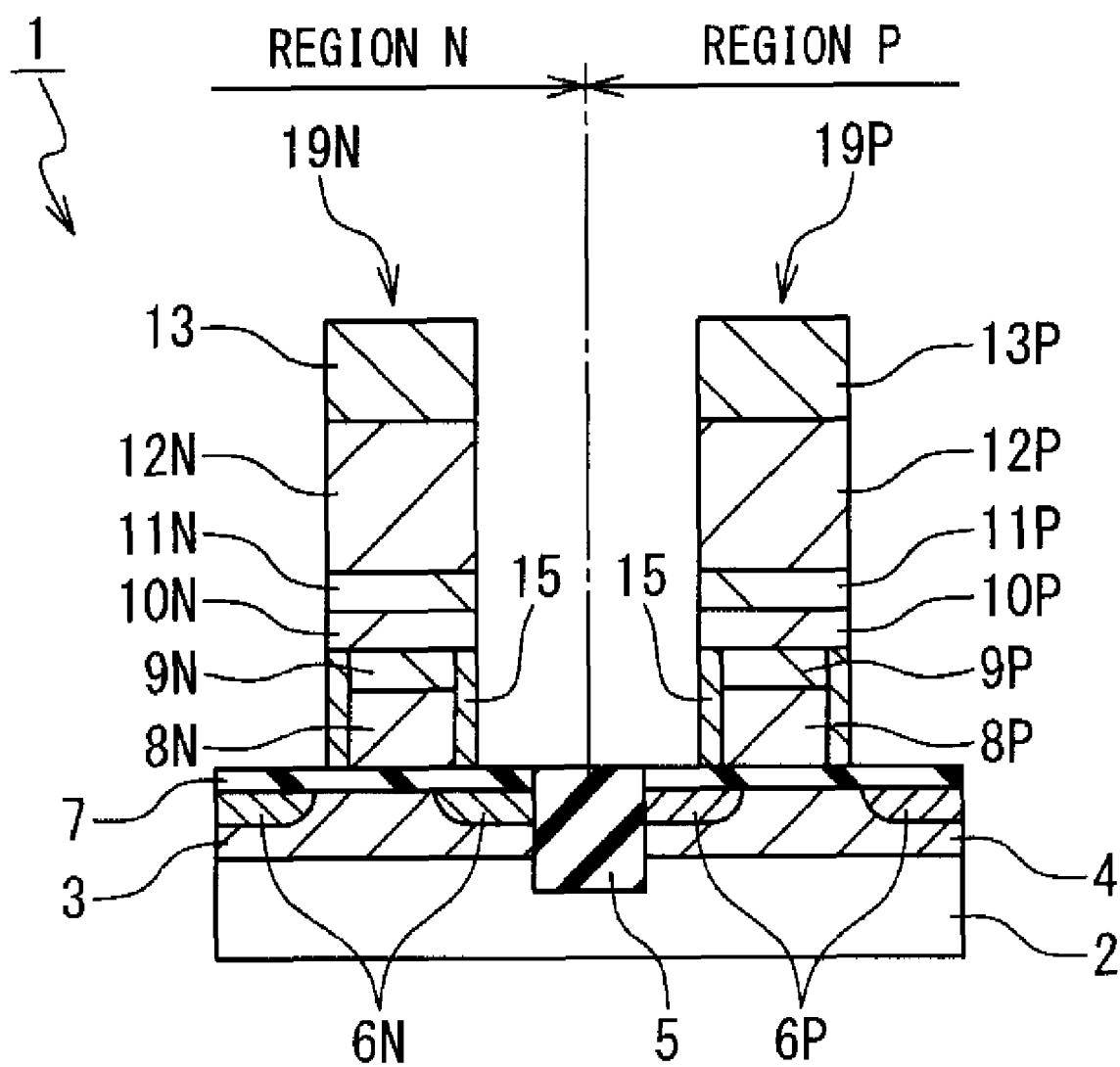
FIG. 1 is a schematic cross sectional view of a semiconductor device according to an embodiment of the present invention.

Hereinafter, a semiconductor device according to an embodiment of the present invention will be described in detail with reference to the attached drawings. FIG. 1 is a schematic cross sectional view showing a cross section structure of a semiconductor device 1 according to an embodiment of the present invention. As shown in FIG. 1, the semiconductor device 1 has a transistor structure formed on a semiconductor substrate 2. In this embodiment, the semiconductor device 1 has a dual gate structure in which an N channel transistor and a P-channel transistor are provided on the semiconductor substrate 2.

As shown in FIG. 1, an element isolation insulating film 5 is embedded in a surface of the semiconductor substrate 2.

The element isolation insulating film 5 divides a semiconductor region into an N channel transistor formation region (to be described as a region N below) and a P-channel transistor formation region (to be described as a region P below). A gate insulating film 7 (e.g., silicon oxide film) is formed on the semiconductor substrate 2 to have the thickness of about 4 nm, and a gate electrode 19 is formed on the semiconductor substrate 2 each region (the region P and the region N) through the gate insulating film 7. In addition, in the following description, the gate electrodes 19 are described as a P-type gate electrode 19P provided in the P region and the N-type gate electrode 19N provided in the N region. Further, the gate electrodes 19 are called without adding P or N if it is not particularly necessary to distinguish them.

In a surface portion of the semiconductor substrate 2 in the region N, a P well layer 3 as a P-type semiconductor layer and source/drain regions 6N are formed for the gate electrode 19N. Further, in a surface portion of the semiconductor substrate 2 in the region P, an N well layer 4 as a N-type semiconductor layer and source/drain regions 6P are formed for the gate electrode 19P. In addition, the P well layer 3 is doped with boron, and the N well layer 4 is doped with phosphor.

Subsequently, a structure of each gate electrode 19 will be described. The gate electrode 19 has a structure in which a silicon layer and a metal-containing layer are formed from the side of the gate insulating film 7. The silicon layer includes a first silicon layer 8 and a second silicon layer 9, which are formed in this order. The silicon layer has a side insulating film 15 on a side surface thereof. Further, the metal-containing layer includes a tungsten silicide layer 10, a tungsten nitride layer 11 and a tungsten layer 12, which are formed in this order. A nitride film 13 is formed on the metal-containing layer.

It should be noted that in the following description, in order to distinguish the P-type gate electrode 19P and the N-type gate electrode 19N, P and N are sometimes added to marks according to a necessity. That is, a first silicon layer 8P indicates a first silicon layer 8 provided in the gate electrode 19P, and a first silicon layer 8N indicates a first silicon layer 8 provided in the gate electrode 19N.

The first silicon layer 8 is formed of polysilicon. The first silicon layer 8N is doped with N-type impurity (e.g., phosphor). On the other hand, the first silicon layer 8P is doped with P-type impurity (e.g., boron). The thickness of each silicon layer 8 is, for example, 50 nm.

The second silicon layer 9 is formed of polysilicon, and is provided to prevent impurity doped in the first silicon layer 8 from diffusing upwardly. The thickness of the second silicon layer 9 is, for example, about 10 nm. The thickness of the second silicon layer 9 is preferably in a range from 5 nm to 20 nm. When the thickness of the second silicon layer 9 is thinner than 5 nm, an effect to prevent the diffusion of impurity is hardly obtained. When the thickness is thicker than 20 nm, transistor characteristics are easily degraded by a depletion of the silicon layer. The second silicon layer 9 is not doped at least with impurity of the same conductive type as that of the first silicon layer 8. That is, the second silicon layer 9P is not doped with a P-type impurity, and the second silicon layer 9N is not doped with the N-type impurity. More specifically, the second silicon layer 9 is a non-doped intrinsic layer or a layer doped with a small amount of impurity of a conductive type opposite to that of impurity in the first silicon layer 8. In addition, when the second silicon layer 9P is doped with phosphor (P) as the impurity of the conductive type opposite to that of the impurity in the first silicon layer 8, the doping concentration is preferably from 1E19 to 1E20 (at/cm$^3$). When the concentration is less than 1E19, an effect to prevent diffusion of the impurity is hardly obtained. When the concentration is more than 1E20, a conductive type may not be the P-type even when the first silicon layer 8 is doped with boron (B).

The tungsten silicide layer 10 is formed on the second silicon layer 9. The tungsten silicide layer 10 is not uniformly continuously formed on the second silicon layer 9 to completely cover the second silicon layer 9, but many tungsten silicide grains are dispersedly arranged to have mutual separation spaces on the second silicon layer 9. That is, the tungsten silicide layer 10 is discontinuously formed. The separation spaces between the tungsten silicide grains are filled with the second silicon layer 9. The thickness of the tungsten silicide layer 10 is preferably in a range of 3 to 10 nm, and more preferably in a range of 5 to 7 nm. When the tungsten silicide layer 10 is thinner than 3 nm, a contact resistance at the interface (interface resistance) may increase. Also, when the layer is thicker than 10 nm, the tungsten silicide layer 10 absorbs dopant in the silicon layer. Thus, transistor characteristics are degraded due to depletion of the silicon layer. In addition, a mutual diffusion is easily caused, in which dopants move between the region N and the region P through the tungsten silicide layer 10.

The tungsten nitride layer 11 is formed on the tungsten silicide layer 10. In addition, the second silicon layer 9 partially contacts the tungsten nitride layer 11 by portions in which tungsten silicide grains are not arranged. The thickness of the tungsten nitride layer 11 is, for example, about 10 nm.

The tungsten layer 12 is formed on the tungsten nitride layer 11. The thickness of the tungsten layer 12 is, for example, about 80 nm.

The nitride film 13 is a silicon nitride film used as a mask at the time of patterning the gate electrode 19. The thickness of the nitride film 13 is, for example, about 200 nm.

The side insulating film 15 is formed to recover any damage of the side of the gate electrode 19 generated at the time of patterning the gate electrode 19.

Figure 2:
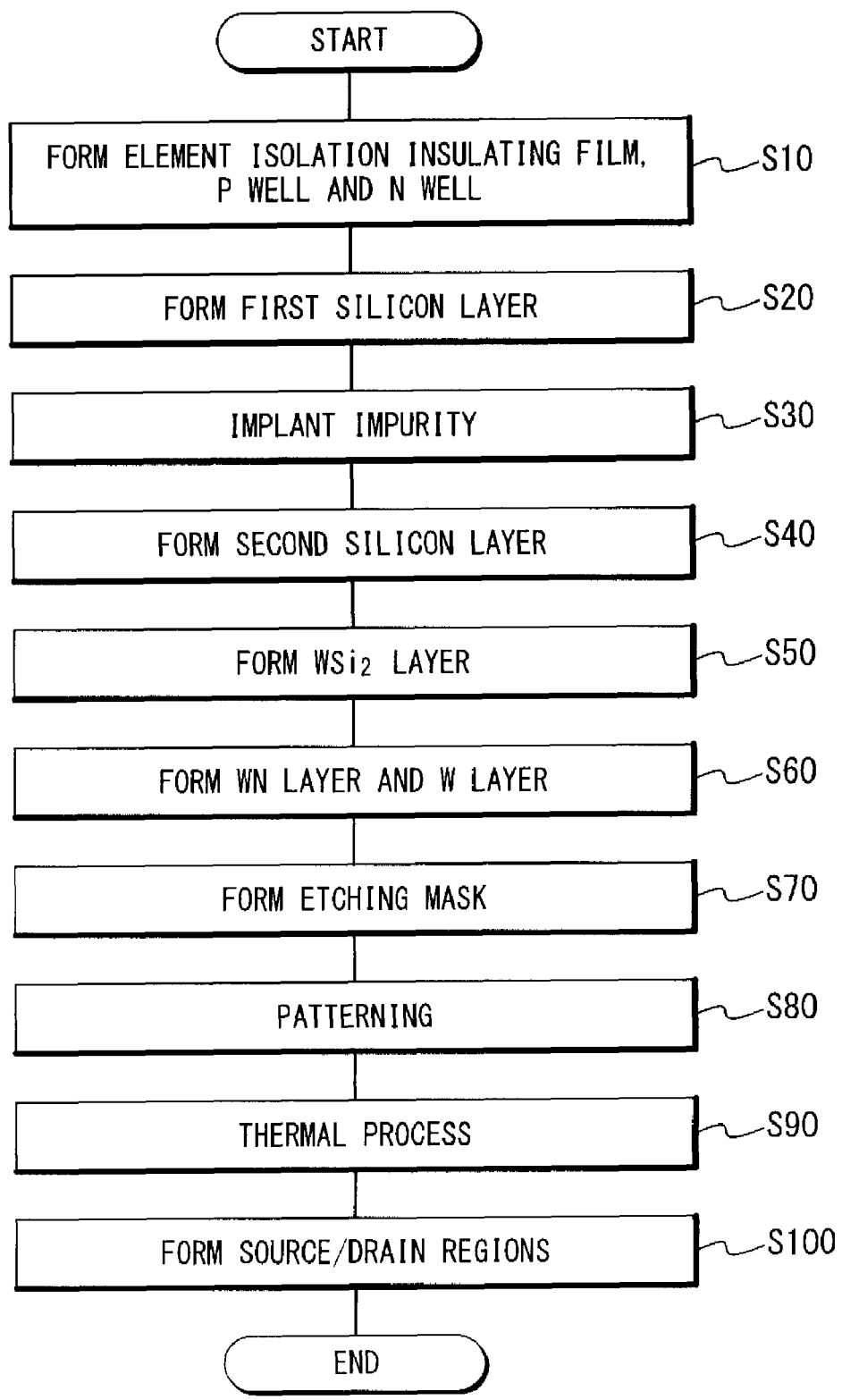
FIG. 2 is a flowchart showing a method of manufacturing the semiconductor device according to the embodiment of the present invention.

Next, a method of manufacturing the semiconductor device having the above-described structure will be described. FIG. 2 is a flowchart of the method of manufacturing the semiconductor device, and FIGS. 3A to 3I are cross sectional views showing the manufacturing process. The semiconductor device according to the embodiment is manufactured through steps from S10 to S100 shown in FIG. 2. Each step will be described in detail below.

Step S10: Element Isolation Insulating Film, P Well Layer, and N Well Layer

Figure 3A:
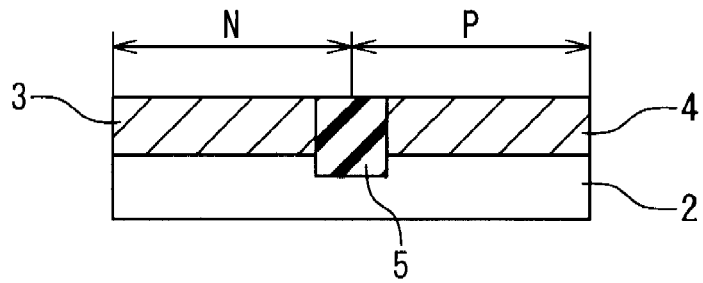
FIGS. 3A to 3I are cross sectional views showing the method of manufacturing the semiconductor device according to the embodiment of the present invention.

As shown in FIG. 3A, an element isolation insulating film 5 is formed in a predetermined region of a semiconductor substrate 2 by an STI (Shallow Trench Isolation) technique, thereby, dividing a region N and a region P. Then, the P well layer 3 is formed by implanting boron (B) as a P-type impurity in the region N or the semiconductor substrate.

Similarly, the N well layer 4 is formed by doping phosphor (P) as the N-type impurity in the region P or the semiconductor substrate.

Step S20: Forming First Silicon Layer

Figure 3B:
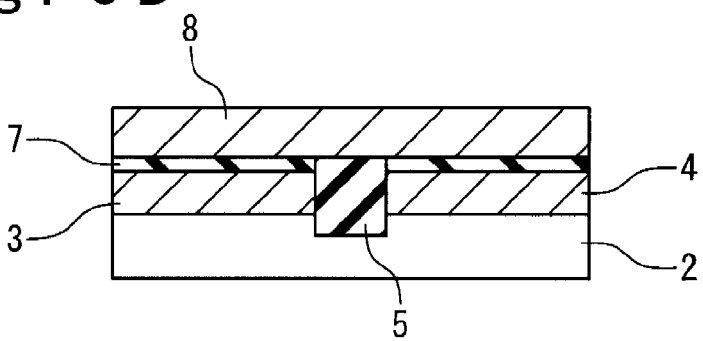

Subsequently, as shown in FIG. 3B, a surface of the semiconductor substrate 2 is thermally oxidized to form a gate insulating film 7 having the thickness of about 4 nm. A first silicon layer 8 is formed on the gate insulating film 7 by a CVD (Chemical Vapor Deposition) method to have the thickness of about 50 nm. The first silicon layer 8 is a non-doped amorphous layer.

Step S30: Implanting Impurity

Figure 3C:
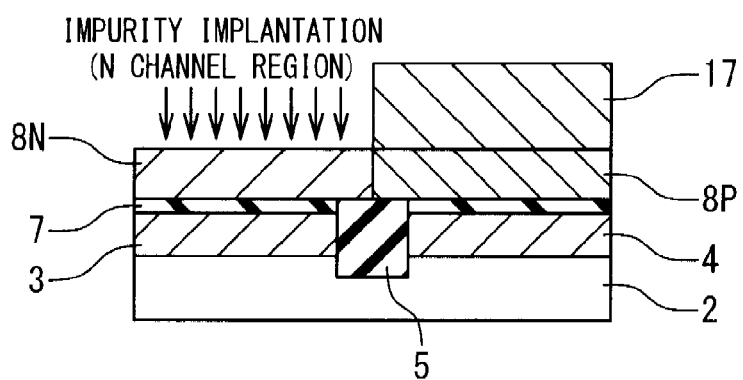
Figure 3D:
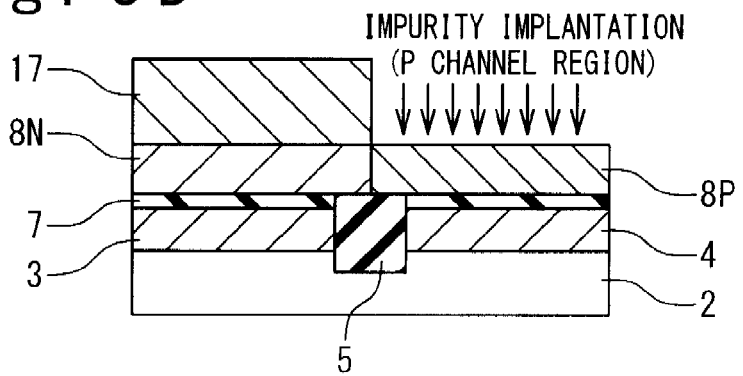

As shown in FIG. 3C, the region P is covered with a resist mask 17 and phosphor (P) is implanted into the silicon layer of the region N as the N-type impurity in the acceleration energy of about 5 keV and a dose amount of about $5E15/cm^2$. Thereby, the first silicon layer 8N in the region N becomes the N-type conductive layer. In addition, as shown in FIG. 3D, the resist mask 17 covering the region P is removed and a resist mask 17 is formed to cover the region N. Then, boron (B) is ion-implanted into the first silicon layer 8P in the region P as the P-type impurity in the acceleration energy of about 3 keV and a dose amount of about 1E15 to $5E16/cm^2$, preferably about 3E15 to $1E16/cm^2$. Thus, the first silicon layer 8P in the region P becomes the P-type conductive layer. Then, a thermal treatment is carried out by a RTA (Rapid Thermal Anneal) method under nitrogen atmosphere at 900° C. for 10 seconds such that the dopant implanted up to a sufficient depth are diffused.

Step S40: Forming Second Silicon Layer

Figure 3E:
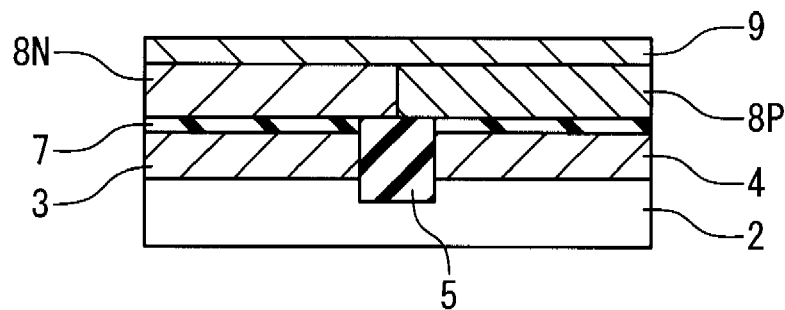

As shown in FIG. 3E, a natural oxide film on the surface of the first silicon layer 8 is removed with hydrofluoric acid (HF) and the second silicon layer 9 having the thickness of about 10 nm is formed by a CVD method. The thickness of the second silicon layer 9 is preferably 5 nm to 20 nm as described above. When the thickness thereof is thinner than 5 nm, an effect to prevent the diffusion of the impurity is hardly obtained. When the thickness thereof is thicker than 20 nm, transistor characteristics are easily degraded by the depletion. In addition, the second silicon layer 9 is amorphous and non-doped or intrinsic.

It should be noted that after forming the non-doped second silicon layer 9, a small amount of impurity of a conductive type opposite to that of the impurity in the first silicon layer 8 may be implanted to the second silicon layer 9. When the impurity of the conductive type opposite to the second silicon layer 9 are implanted, the impurity doped into the first silicon layer 8 and the second silicon layer 9 mutually interfere to suppress transferring the impurity from the first silicon layer 8 into the second silicon layer 9. Thus, it can be suppressed that the impurity is absorbed by the tungsten silicide layer 10 formed in a following process. This effect is particularly remarkable when the small amount of the N-type impurity (e.g., phosphor) is implanted into the second silicon layer 9P in the region P. In addition, when phosphor (P) is doped into the second silicon layer 9P as the impurity of the conductive type opposite to that of the impurity in the first silicon layer 8, the impurity concentration is preferably from 1E19 to 1E20 (at/$cm^3$).

Step S50: Forming Tungsten Silicide Layer

Figure 3F:
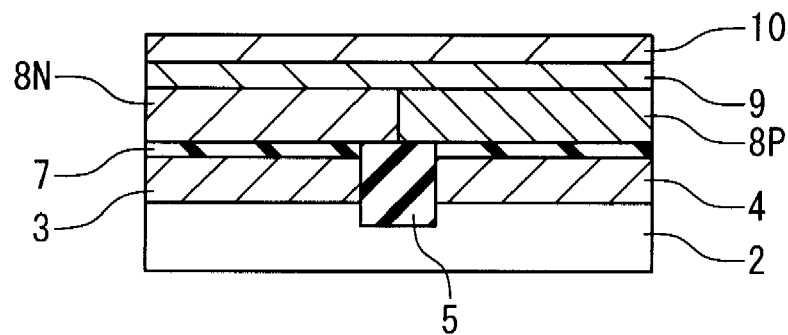

Subsequently, a natural oxide film formed on the surface of the second silicon layer 9 is removed by using a mixing liquid of hydrofluoric acid (HF) and hydrogen peroxide water ($H_2O_2$). Then, as shown in FIG. 3F, the tungsten silicide ($WSi_2$) layer 10 is formed on the second silicon layer 9. At this time, a lower layer of the tungsten silicide layer 10 is the second silicon layer 9, and the impurity doped into the first silicon layer 8 does not exist. Thus, it is possible to prevent the impurities doped into the first silicon layer 8 from diffusing into the tungsten silicide layer 10. Thus, it is possible to prevent the impurities doped into the first silicon layer 8 from mutually diffusing between the region N and the region P through the tungsten silicide layer 10.

It is preferable to form the tungsten silicide layer 10 discontinuously. For example, the discontinuous tungsten silicide layer 10 can be formed by a CVD method, by setting the pressure of a reaction chamber to about 30 to 100 Pa and the temperature of the semiconductor substrate 2 to about 550° C., supplying dichlorosilane (SiH$_2$Cl$_2$) in the flow rate of about 200 sccm and tungsten hexafluoride (WF$_6$) in the flow rate of about 5 sccm so that they react for about 10 seconds. The tungsten silicide layer 10 is formed under the above conditions that many tungsten silicide grains are dispersedly arranged with separation spaces. It should be noted that when the second silicon layer 9 is non-doped, the discontinuous tungsten silicide layer 10 can be easily formed. Therefore, when the second silicon layer 9 is non-doped, the reaction conditions to form the discontinuous tungsten silicide layer 10 can be set with a margin. Further, that the film thickness of the tungsten silicide layer 10 is preferable to be about 3 to 10 nm, and more preferable to be about 5 to 7 nm. When the thickness thereof is thinner than 3 nm, the contact resistance in the interface (interface resistance) may increase. On the other hand, when the thickness is thicker than 10 nm, transistor characteristics may be degraded, or the dopant diffuses easily mutually through the tungsten silicide layer 10.

By discontinuously forming the tungsten silicide layer 10, mutual diffusion of impurities between the region N and the region P can be more effectively restricted. Particularly, when the tungsten silicide layer 10 in the region P is discontinuous, mutually diffusion of boron in the first silicon layer 8 can be effectively restricted.

Further, after the tungsten silicide layer 10 is formed, it is preferable to form a continuous silicon film on the tungsten silicide layer 10. For example, such a uniform continuous silicon film is formed by stopping supply of WF$_6$ for the formation of the tungsten silicide layer, and by supplying dichlorosilane in the flow rate of about 300 sccm and Argon (Ar) in the flow rate of about 800 sccm. In addition, the temperature of the semiconductor substrate 2 is set to about 500° C. and the pressure in the reaction chamber is set to about 50 to 300 Pa, and a thermal treatment of the semiconductor substrate 2 is performed for about 5 to 120 seconds, preferably 40 to 120 seconds. Through this process, a non-doped silicon film is formed between the tungsten silicide grains or on these grains. The non-doped intrinsic silicon film formed at this time is uniformly continuous, unlike the tungsten silicide layer 10. When the tungsten silicide layer 10 is discontinuous, the resistance of an electrode may increase. However, by forming the continuous silicon, increase in the resistance can be suppressed. In addition, the silicon film formed in this process is connected with the second silicon layer 9 formed in the process of S40, and thus is substantially a part of the second silicon layer 9.

In addition, when the thickness of the silicon film formed in this process is too thin, an effect to suppress the increase of the resistance cannot be sufficiently obtained. When the thickness thereof is too thick, conductivities of the tungsten nitride (WN) layer 11, the tungsten (W) layer 12, the tungsten silicide layer 10, and the silicon layer become low, so that the resistance of the gate electrode 19 may increase. Therefore, the thickness of the silicon film formed in this process is preferably about 0.3 to 1.5 nm. The thickness of the silicon film can be controlled to a desired thickness by properly changing the pressure of the reaction chamber, the time to form a film (treatment time), and the flow rate of dichlorosilane.

Subsequently, chlorine or fluorine gas remained in the CVD process is removed. That is, a thermal treatment (RTA: Rapid Thermal Annealing) is carried out as a degasifying treatment at about 830° C. for about 30 seconds under an N$_2$ atmosphere. This thermal treatment simultaneously activates the N-type impurity implanted into the first silicon layer 8N in the region N and the P-type impurity implanted into the first silicon layer 8P in the region P. Further, the first silicon layer 8 and the second silicon layer 9 are converted from amorphous layers into polysilicon layers.

Step S60: Forming Tungsten Nitride Layer and Tungsten Layer

Figure 3G:
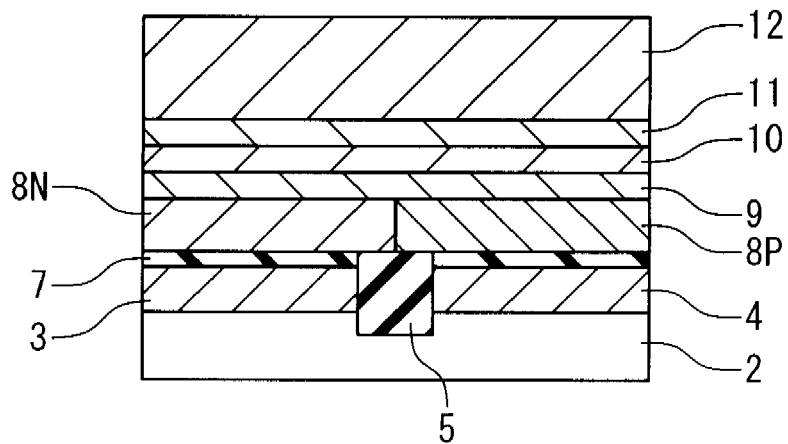

As shown in FIG. 3G, the tungsten nitride (WN) layer 11 having the thickness of about 10 nm is formed as a metal nitride layer by a sputtering method. Then, a tungsten (W) layer 12 having the thickness of about 80 nm is formed on the tungsten nitride layer 11 as a metal layer by a sputtering method.

Step S70: Forming Etching Mask

Figure 3H:
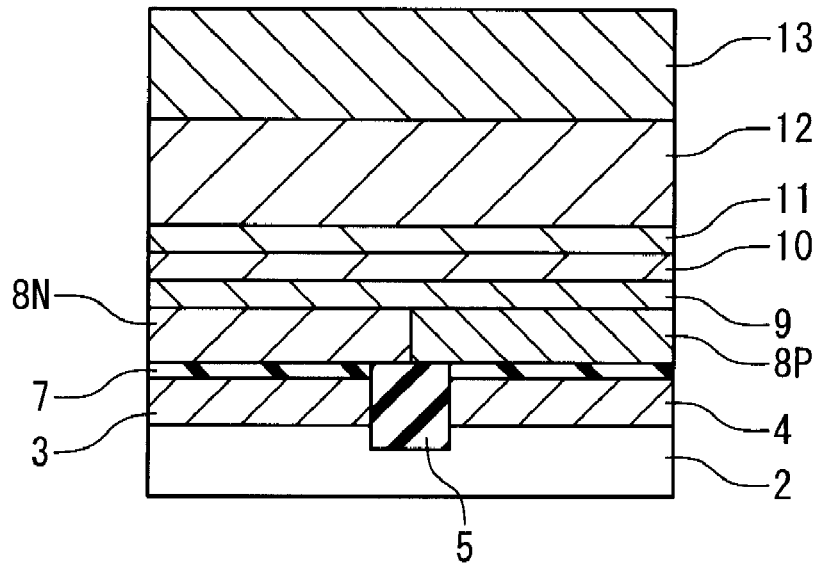

As shown in FIG. 3H, the silicon nitride layer having the thickness of about 200 nm is formed on the tungsten layer 12 by a CVD method, and is patterned to the shape of gate electrodes. The silicon nitride film becomes an etching mask 13.

Step S80: Patterning

Figure 3I:
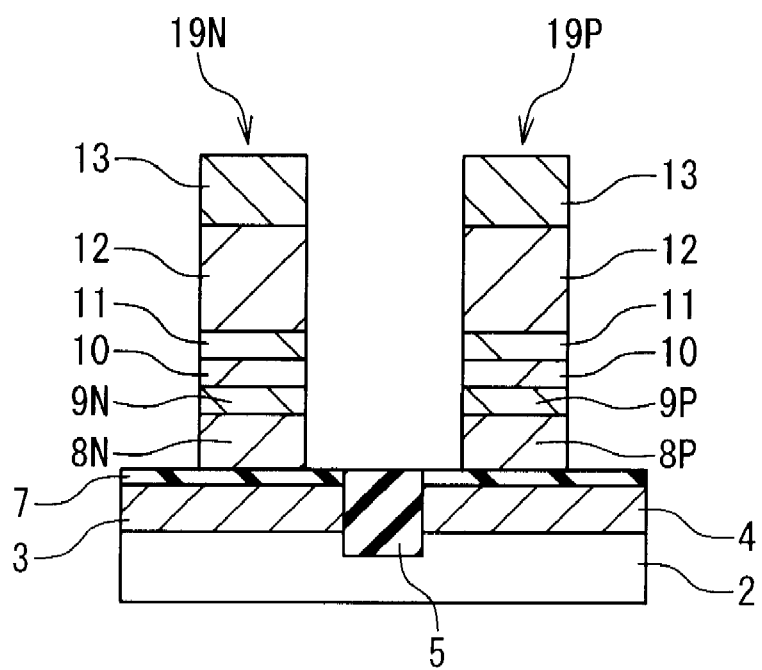

Subsequently, as shown in FIG. 3I, the silicon nitride film 13 is used as the etching mask and a laminated film including the tungsten layer 12, the tungsten nitride layer 11, the tungsten silicide layer 10, the first silicon layer 8, and the second silicon layer 9 is patterned by dry etching. Thereby, the N-type gate electrode 19N including the N-type polysilicon layer is formed in the region N, and the P-type gate electrode 19P including the P-type polysilicon layer is formed in the region P.

Step S90: Thermal Treatment

In order to recover the side of each gate electrode from damage due to the patterning in the step S80, a thermal treatment is carried out. Through this thermal treatment, the side insulating film 15 is formed on the side surface of the polysilicon layer (the first and second silicon layers) of each gate electrode 19 so as to recover the damage.

When a part of the silicon layer contacts the tungsten nitride layer 11, the second silicon layer 9 reacts with the tungsten nitride layer 11 through the thermal treatment to recover the damage (to form the side insulating film 15), and thus a tungsten silicide nitride layer (WSiN layer) may be formed. However, in the present embodiment, the tungsten nitride layer 11 does not contact the polysilicon layer including a high concentration impurity, but contact a non-doped silicon film (the second silicon layer 9). Thus, even if the WSiN layer is formed, this layer is remarkably thin. Therefore, it is possible to prevent the resistance of the gate electrode 19 from increasing. In addition, a reason why the formation of the WSiN layer can be prevented is in that the silicon film (the second silicon film 9) contacting the tungsten nitride layer 11 is non-doped, and thus the silicon film hardly reacts with the tungsten nitride layer 11 even when the thermal treatment is carried out, as described in the present embodiment. On the other hand, when the thermal treatment is carried out while the tungsten nitride layer is in contact with the silicon layer including a large amount of impurity like a conventional example, the impurity included in the silicon layer would accelerate to reaction of the silicon layer with the tungsten nitride layer, and thus a thick WSiN layer is easily formed.

Step S100: Forming Source/Drain Regions

Source/drain regions 6N are formed by covering the region P with a resist mask (not shown), and ion-implanting a high concentration N-type impurity (e.g., arsenic (As)) into the region N. Then, the resist mask covering the region P is removed and source/drain regions 6P are formed by forming a resist mask (not shown) by covering the region N, and ion-implanting the high concentration P-type impurity (e.g., boron (B)) in to the region P.

Through the above-described steps, an N channel transistor including the N-type gate electrode 19N in the region N and a P-channel transistor including the P-type gate electrode 19P in the region P are completed as shown in FIG. 1.

When the method of manufacturing a semiconductor device according to the present embodiment is employed, the second silicon layer 9 is non-doped, or is doped with impurity of a conductive type opposite to that of the impurity in the first silicon layer 8. Thus, the diffusion of the impurity doped into the first silicon layer 8 into a metal-containing layer can be prevented. Thereby, the impurity may be provided to the whole of the silicon layer without lacking the amount of the impurity included in the first silicon layer 8. Thus, degradation of the transistors due to the depletion can be prevented. As a result of this, a resistance near the interface between the gate electrode 19 and the gate insulating film 7 does not increase, and thus the operation of a device can be kept at a high speed.

Further, although the metal silicon nitride is generated when the silicon layer contacts the metal nitride layer (e.g., tungsten nitride), the thickness of the generated layer can be thin. Thus, increase of the resistance of the gate electrode can be suppressed.

Further, even when the metal silicide layer contacts the silicon layer, diffusion of the impurity from the silicon layer into the metal silicide layer can be prevented. Thus, when the semiconductor device having a dual gate structure is manufactured, mutual diffusion of the impurities between the region N and the region P through the metal silicide layer during the manufacturing process can be prevented. Furthermore, when the metal silicide layer is discontinuously formed, a prevention effect of mutual diffusion of the impurities can be synergistically improved.

In addition, although the embodiments of the present invention have been described above, the present invention is not limited to these embodiments. The present invention can be variously modified within a scope of the present invention. For example, an example using tungsten as a metal included in a metal-containing layer has been described in the above-described embodiments. Tungsten is preferable as a gate electrode since it has thermal resistance and oxidation resistance. However, the metal included in a metal-containing layer is not limited in tungsten. For example, other refractory metals such as cobalt (Co), titanium (Ti), nickel (Ni), molybdenum (Mo), and tantalum (Ta) can be used.

What is claimed is:

1. A semiconductor device comprising:
    an N-channel transistor having an N-type gate electrode and a P-channel transistor having a P-type gate electrode which are formed on a semiconductor substrate,
    wherein said P-type gate electrode comprises:
        a first silicon layer formed as the lowest layer, and doped with a P-type impurity;
        a second silicon layer formed on said first silicon layer; and
        a first metal containing layer formed on said second silicon layer,
    wherein said N-type gate electrode comprises:
        a third silicon layer formed as the lowest layer and doped with an N-type impurity;
        a fourth silicon layer formed on said third silicon layer; and
        a second metal containing layer formed on said fourth silicon layer,
    wherein at least one of said second silicon layer and said fourth silicon layer is doped with no impurity or an impurity of a conductive type opposite to that of the impurity in a corresponding one of said first silicon layer and said third silicon layer, and
    wherein said at least one of said second silicon layer and said fourth silicon layer is configured to substantially prevent said impurity in said corresponding one of said first silicon layer and said third silicon layer from diffusing toward said corresponding one of said first metal containing layer and said second metal containing layer.

2. The semiconductor device according to claim 1, wherein said first metal containing layer and said second metal containing layer each comprise:
    a metal silicide layer;
    a metal nitride layer formed on said metal silicide layer; and
    a metal layer formed on said metal nitride layer, and
    said metal silicide layer is formed for silicon grains to be dispersedly and discontinuously arranged.

3. The semiconductor device according to claim 2, further comprising:
    a fifth silicon layer and a sixth silicon layer formed between said corresponding metal silicide layer and said corresponding metal nitride layer of said first metal containing layer and said second metal containing layer, respectively,
    wherein silicon grains of said fifth silicon layer and said sixth silicon layer are continuously arranged.

4. The semiconductor device according to claim 1, wherein said metal is a refractory metal selected from the group consisting of Co, Ti, W, Ni, Mo, and Ta.

5. The semiconductor device according to claim 1, wherein said second silicon layer and said fourth silicon layer are doped with impurities of conductive types opposite to that of the impurities in said first silicon layer and said third silicon layer, respectively.

6. A semiconductor device comprising:
    a gate electrode formed on a gate insulating film, which is formed on a semiconductor substrate,
    wherein said gate electrode comprises:
        a silicon layer formed in contact with said gate insulating film; and
        a metal containing layer formed on said silicon layer,
    said silicon layer comprises:
        a first silicon layer provided on said gate insulating film and doped with an impurity of a first conductive type; and
        a second silicon layer formed on said first silicon layer and doped with no impurity or an impurity of a second conductive type opposite to the first conductive type,
    wherein said second silicon layer is configured to substantially prevent said impurity of said first conductive type from diffusing toward said metal containing layer.

7. The semiconductor device according to claim 6, wherein said metal containing layer comprises:
    a metal silicide layer formed on said second silicon layer;
    a metal nitride layer formed on said metal silicide layer; and
    a metal layer formed on said metal nitride layer.

8. The semiconductor device according to claim 6, wherein said metal is at least one refractory metal selected from the group consisting of Co, Ti, W, Ni, Mo, and Ta.

9. The semiconductor device according to claim 8, wherein a metal contained in said metal is tungsten (W).

10. The semiconductor device according to claim 6, wherein an impurity of the second conductive type is doped into said second silicon layer.

11. The semiconductor device according to claim 6, wherein the first conductive type is a P-type, and boron (B) is doped into said first silicon layer.

12. The semiconductor device according to claim 1, wherein a thickness of said at least one of said second silicon layer and said fourth silicon layer is in a range from 5 nm to 20 nm.

13. The semiconductor device according to claim 6, wherein a thickness of said second silicon layer is in a range from 5 nm to 20 nm.

14. A semiconductor device comprising:
an N-channel transistor having an N-type gate electrode and a P-channel transistor having a P-type gate electrode which are formed on a semiconductor substrate,
wherein said P-type gate electrode comprises:
a first silicon layer formed as the lowest layer, and doped with a P-type impurity;
a second silicon layer formed on said first silicon layer; and
a metal containing layer formed on said second silicon layer,
wherein said N-type gate electrode comprises:
a third silicon layer formed as the lowest layer and doped with an N-type impurity;
a fourth silicon layer formed on said third silicon layer; and
a metal containing layer formed on said fourth silicon layer,
wherein at least one of said second silicon layer and said fourth silicon layer is doped with no impurity or an impurity of a conductive type opposite to that of the impurity in a corresponding one of said first silicon layer and third silicon layer,
wherein said metal containing layer comprises:
a metal suicide layer;
a metal nitride layer formed on said metal silicide layer; and
a metal layer formed on said metal nitride layer, and
wherein said metal silicide layer is formed for silicon grains to be dispersedly and discontinuously arranged.

15. The semiconductor device according to claim 14, further comprising:
a fifth silicon layer formed between said metal silicide layer and said metal nitride layer, wherein silicon grains of said fifth silicon layer are continuously arranged.

16. A semiconductor device comprising a gate electrode formed on a semiconductor substrate through a gate insulating film,
wherein said gate electrode comprises:
a silicon layer formed in contact with said gate insulating film; and
a metal containing layer formed on said silicon layer,
said silicon layer comprises:
a first silicon layer provided on said gate insulating film and doped with an impurity of a first conductive type; and
a second silicon layer formed on said first silicon layer and doped with no impurity or an impurity of a second conductive type opposite to the first conductive type,
wherein said metal containing layer comprises:
a metal silicide layer formed on said second silicon layer;
a metal nitride layer formed on said metal silicide layer; and
a metal layer formed on said metal nitride layer.

17. The semiconductor device according to claim 16, wherein the first conductive type is a P-type, and boron (B) is doped into said first silicon layer.

* * * * *